US010080068B2

(12) United States Patent
Sobanski

(10) Patent No.: US 10,080,068 B2
(45) Date of Patent: Sep. 18, 2018

(54) PROTECTED WIRELESS NETWORK

(71) Applicant: UNITED TECHNOLOGIES CORPORATION, Farmington, CT (US)

(72) Inventor: Kurt J. Sobanski, Glastonbury, CT (US)

(73) Assignee: United Technologies Corporation, Farmington, CT (US)

(*) Notice: Subject to any disclaimer, the term of this patent is extended or adjusted under 35 U.S.C. 154(b) by 0 days.

(21) Appl. No.: 15/114,234

(22) PCT Filed: Feb. 20, 2015

(86) PCT No.: PCT/US2015/016761
§ 371 (c)(1),
(2) Date: Jul. 26, 2016

(87) PCT Pub. No.: WO2015/130563
PCT Pub. Date: Sep. 3, 2015

(65) Prior Publication Data
US 2017/0238069 A1 Aug. 17, 2017

Related U.S. Application Data

(60) Provisional application No. 61/946,064, filed on Feb. 28, 2014.

(51) Int. Cl.
H04B 17/00 (2015.01)
H04Q 1/02 (2006.01)
(Continued)

(52) U.S. Cl.
CPC ........... *H04Q 1/116* (2013.01); *F01D 21/003* (2013.01); *F02C 3/04* (2013.01); *F02C 9/00* (2013.01);
(Continued)

(58) Field of Classification Search
CPC ... H04Q 1/116; F02C 3/04; F02C 9/00; F02K 3/04; H04B 1/3822; H04B 15/025; F05D 2220/32; F05D 2260/80; H04W 84/18
(Continued)

(56) References Cited

U.S. PATENT DOCUMENTS

2005/0040934 A1* 2/2005 Shanton .................... A47F 5/11
340/5.92
2006/0270354 A1 11/2006 de La Chapelle et al.
(Continued)

FOREIGN PATENT DOCUMENTS

GB 886127 A 1/1962
WO 00/79369 A1 12/2000

OTHER PUBLICATIONS

International Search Report and Written Opinion for PCT Application No. PCT/US2015/016761 dated May 28, 2015.
(Continued)

*Primary Examiner* — Lee Nguyen
(74) *Attorney, Agent, or Firm* — Carlson, Gaskey & Olds, P.C.

(57) ABSTRACT

A system for a machine component includes at least one local transmitter/receiver. At least one device is associated with a component and configured to communicate with the at least one local transmitter/receiver through wireless signals. Shielding surrounds both the local transmitter and the device for containing the wireless signals proximate to the component. A remote processing unit is disposed outside of the shielding in communication with the local transmitter/receiver. A control system and method are also disclosed.

16 Claims, 2 Drawing Sheets

(51) Int. Cl.
| | | |
|---|---|---|
| H04Q 9/00 | (2006.01) | |
| H01Q 5/55 | (2015.01) | |
| F01D 21/00 | (2006.01) | |
| H04L 12/24 | (2006.01) | |
| H04Q 1/28 | (2006.01) | |
| F02K 3/06 | (2006.01) | |
| G07C 5/00 | (2006.01) | |
| H04B 15/02 | (2006.01) | |
| H04W 12/04 | (2009.01) | |
| G01M 15/14 | (2006.01) | |
| H04B 1/02 | (2006.01) | |
| F02C 3/04 | (2006.01) | |
| F02C 9/00 | (2006.01) | |
| H01P 3/12 | (2006.01) | |
| H01P 5/02 | (2006.01) | |
| H05K 9/00 | (2006.01) | |
| H04L 12/40 | (2006.01) | |
| G06K 7/10 | (2006.01) | |
| G07C 5/08 | (2006.01) | |
| F02K 3/04 | (2006.01) | |
| H04B 1/3822 | (2015.01) | |
| H04B 1/00 | (2006.01) | |
| H04L 29/08 | (2006.01) | |
| H04W 84/18 | (2009.01) | |
| H04W 84/12 | (2009.01) | |

(52) U.S. Cl.
CPC .............. *F02K 3/04* (2013.01); *F02K 3/06* (2013.01); *G01M 15/14* (2013.01); *G06K 7/10188* (2013.01); *G07C 5/008* (2013.01); *G07C 5/0808* (2013.01); *H01P 3/122* (2013.01); *H01P 5/02* (2013.01); *H01Q 5/55* (2015.01); *H04B 1/02* (2013.01); *H04B 1/3822* (2013.01); *H04B 15/02* (2013.01); *H04B 15/025* (2013.01); *H04L 12/40045* (2013.01); *H04L 41/0803* (2013.01); *H04Q 1/28* (2013.01); *H04Q 9/00* (2013.01); *H04W 12/04* (2013.01); *H05K 9/0081* (2013.01); *F05D 2220/32* (2013.01); *F05D 2220/323* (2013.01); *F05D 2260/80* (2013.01); *F05D 2270/54* (2013.01); *F05D 2270/80* (2013.01); *H04L 67/10* (2013.01); *H04L 67/12* (2013.01); *H04L 2012/40273* (2013.01); *H04Q 2209/40* (2013.01); *H04W 84/12* (2013.01); *H04W 84/18* (2013.01)

(58) Field of Classification Search
USPC ...................................... 455/67.12, 300, 301
See application file for complete search history.

(56) References Cited

U.S. PATENT DOCUMENTS

| | | |
|---|---|---|
| 2007/0199989 A1 | 8/2007 | Piety et al. |
| 2010/0049377 A1 | 2/2010 | Scheid et al. |
| 2011/0300809 A1 | 12/2011 | Gordiyenko et al. |

OTHER PUBLICATIONS

International Preliminary Report on Patentability for PCT Application No. PCT/US2015/016761 dated Sep. 15, 2016.
European Search Report for EP Application No. 15754972.6 dated Nov. 10, 2017.

* cited by examiner

PROTECTED WIRELESS NETWORK

CROSS REFERENCE TO RELATED APPLICATION

This application claims priority to U.S. Provisional Application No. 61/946,064 filed on Feb. 28, 2014.

BACKGROUND

A gas turbine engine typically includes a fan section, a compressor section, a combustor section and a turbine section. Air entering the compressor section is compressed and delivered into the combustion section where it is mixed with fuel and ignited to generate a high-speed exhaust gas flow. The high-speed exhaust gas flow expands through the turbine section to drive the compressor and the fan section. The compressor section typically includes low and high pressure compressors, and the turbine section includes low and high pressure turbines.

Detailed knowledge of gas turbine engine and other machinery operation for control or health monitoring requires sensing systems that need information from locations that are sometimes difficult to access due to moving parts, internal operating environment or machine configuration. The access limitations make wire routing bulky, expensive and vulnerable to interconnect failures. The sensor and interconnect operating environments for desired sensor locations often exceed the capability of the interconnect systems. In some cases, cable cost, volume and weight exceed the allowable limits for practical applications.

Application of wireless sensor technologies to address the wiring constraints faces the challenge of providing reliable communications in a potentially unknown environment with potential interference from internal or external sources.

SUMMARY

In one exemplary embodiment, a system for a machine component includes at least one local transmitter/receiver. At least one device is associated with a component and configured to communicate with the at least one local transmitter/receiver through wireless signals. Shielding surrounds both the local transmitter and the device for containing the wireless signals proximate to the component. A remote processing unit is disposed outside of the shielding in communication with the local transmitter/receiver.

In a further embodiment of the above, the component includes a plurality of machine components and each of the plurality of machine components includes shielding surrounding a local transmitter/receiver and at least one control/sensing device.

In a further embodiment of any of the above, includes a shielded transmission path for communicating between the remote processing unit and the local transmitter/receiver.

In a further embodiment of any of the above, the transmission path includes a physical connection between the remote processing unit and the local transmitter/receiver.

In a further embodiment of any of the above, the device includes one of a radio frequency device, an optic device, and an electro-magnetic device.

In a further embodiment of any of the above, the device includes one or more of a control device and a sensing device.

In a further embodiment of any of the above, includes a sub-component and at least one device associated with the sub-component and in communication with the local transmitter/receiver of a corresponding component through a waveguide transmission path.

In one exemplary embodiment, a system for a gas turbine engine includes at least one local transmitter/receiver mounted proximate to a component of the gas turbine engine. At least one device is associated with the component and configured to communicate with the local transmitter/receiver through wireless signals. Shielding surrounds both the local transmitter and the device for containing the wireless signals proximate the component. A remote processing unit is disposed outside of the shielding in communication with the local transmitter/receiver.

In one exemplary embodiment, the component is part of at least one of a fan section, a compressor section, a combustor section and a turbine section.

In a further embodiment of any of the above, the component contains a parameter of interest to the control and health monitoring system. The parameter of interest is one of a pressure, a temperature, a speed, a position, vibration and proximity.

In a further embodiment of any of the above, the transmission path includes a shielded physical connection between the remote processing unit and the local transmitter/receiver.

In one exemplary embodiment, a method of communicating information within a machine includes shielding a volume associated with a component such that wireless signals generated within the shielded volume are not transmitted outside of the shielded volume, communicating information indicative of component operation with a device located within the shielded volume, and communicating information between the device to a remote processing unit outside of the shielded volume with at least one local transmitter/receiver within the shielded volume.

In a further embodiment of the above, communicating over a transmission path including a physical shielded connection between the remote processing unit and the local transmitter/receiver.

In a further embodiment of any of the above, the device communicates a signal including information indicative of component operation to the local transmitter/receiver and then through the transmission path to the remote processing unit.

In a further embodiment of any of the above, the control/sensing device includes a control device and communicating information indicative of component operation comprises transmitting a signal directing actuation of the control device from the remote processing unit through the transmission path to the local transmitter/receiver and through a wireless signal from the local transmitter/receiver to the control device.

Although the different examples have the specific components shown in the illustrations, embodiments of this disclosure are not limited to those particular combinations. It is possible to use some of the components or features from one of the examples in combination with features or components from another one of the examples.

These and other features disclosed herein can be best understood from the following specification and drawings, the following of which is a brief description.

DETAILED DESCRIPTION

Figure 1:
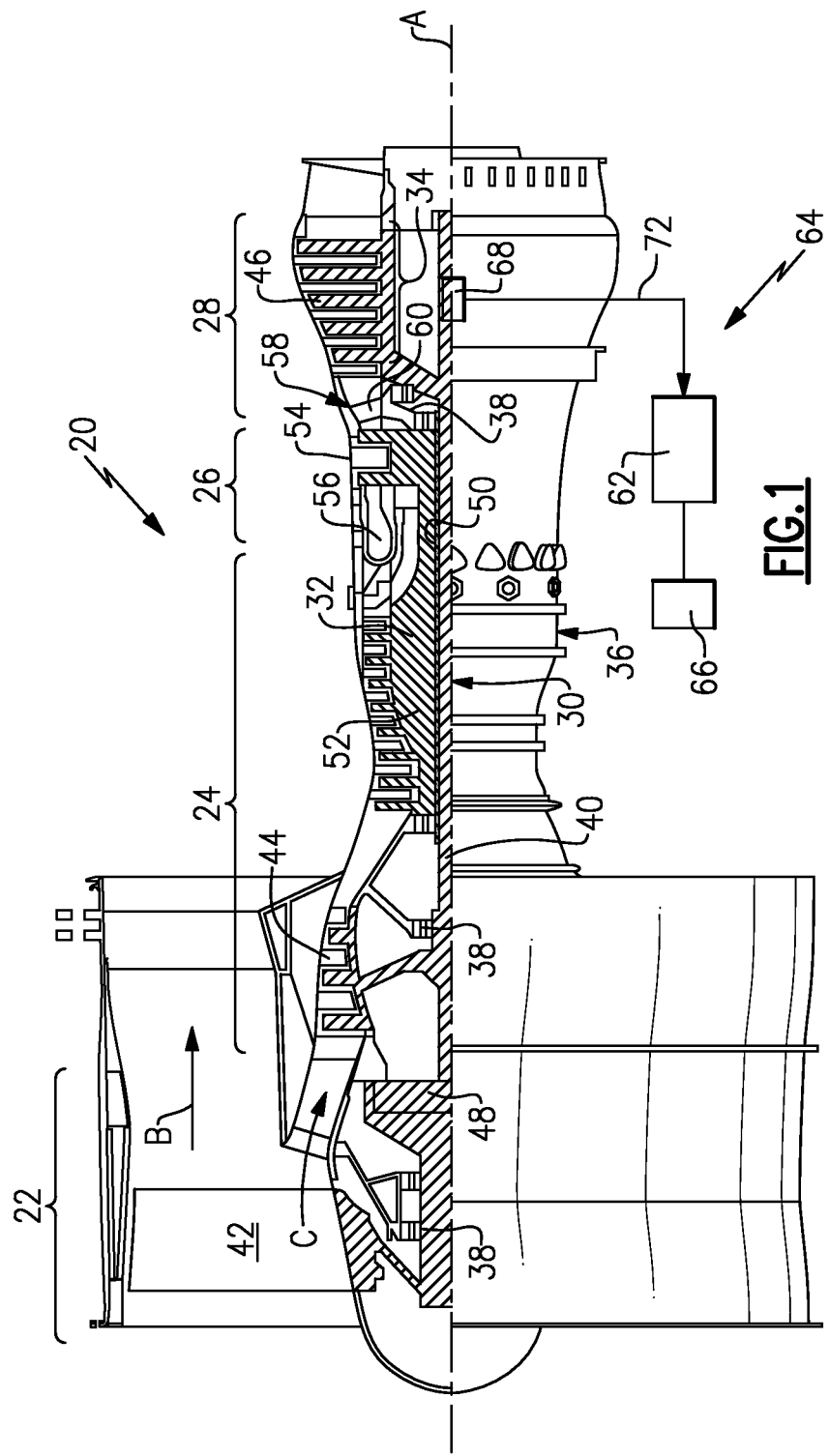
FIG. 1 is a schematic view of an example gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flow path B in a bypass duct defined within a nacelle 15, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures or any other machines that requires sensors to operate with similar environmental challenges or constraints.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 58 of the engine static structure 36 is arranged generally between the high pressure turbine 54 and the low pressure turbine 46. The mid-turbine frame 58 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 58 includes airfoils 60 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet (10.67 km). The flight condition of 0.8 Mach and 35,000 ft (10.67 km), with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of [(Tram ° R)/(518.7° R)]10.5. The "Low corrected fan tip speed" as disclosed herein according to one non-limiting embodiment is less than about 1150 ft/second (350 m/second).

The example gas turbine engine includes the fan 42 that comprises in one non-limiting embodiment less than about twenty-six (26) fan blades. In another non-limiting embodiment, the fan section 22 includes less than about twenty (20) fan blades. Moreover, in one disclosed embodiment the low pressure turbine 46 includes no more than about six (6) turbine rotors schematically indicated at 34. In another non-limiting example embodiment the low pressure turbine 46 includes about three (3) turbine rotors. A ratio between the number of fan blades 42 and the number of low pressure turbine rotors is between about 3.3 and about 8.6. The example low pressure turbine 46 provides the driving power to rotate the fan section 22 and therefore the relationship between the number of turbine rotors 34 in the low pressure turbine 46 and the number of blades 42 in the fan section 22 disclose an example gas turbine engine 20 with increased power transfer efficiency.

The disclosed example gas turbine engine 20 includes a control and health monitoring system 64 utilized to monitor component performance and function. In this example, a control sensing device (CSD) 68 is coupled to a pressure source within a sub-system component 74. The CSD 68 communicates wirelessly through a path comprised of a transmission path 78 and a path 62 within a sub-system component 74. The path may also be extended along one or more shielded paths 72 to remote CSDs 68 in separate sub-system components 74. This entire path comprises the shielded wireless network (SWiN). The SWiN is in communication with a remote processing unit (RPU) 66 that may transmit signals to the CSD 68, and/or receive information indicative of current operation of the component being monitored. The transmission media for any portion of the SWiN may include solid, liquid or gaseous material. In this example, a pressure internal to the shielded component 80 is monitored and that information transmitted through the SWiN 62 to the RPU 66 for use in controlling engine operation or monitoring the component's health. However, it should be understood that it is within the contemplation of this disclosure that the disclosed system 64 may be utilized to control and/or monitor any component function or characteristic of a turbomachine or aircraft component operation.

Prior control & diagnostic system architecture utilized in various applications include centralized system architecture in which the processing functions reside in an electronic control module. Redundancy to accommodate failures and continue system operation systems are provided with dual channels with functionality replicated in both control channels. Actuator and sensor communication is accomplished through analog wiring for power, command, position feedback, sensor excitation and sensor signals. Cables and connections include shielding to minimize effects caused by electromagnetic interference (EMI). The use of analog wiring and the required connections limits application and capability of such systems and application to components that can be located in harsh environments that experience extremes in temperature, pressure, and/or vibration.

Figure 2:
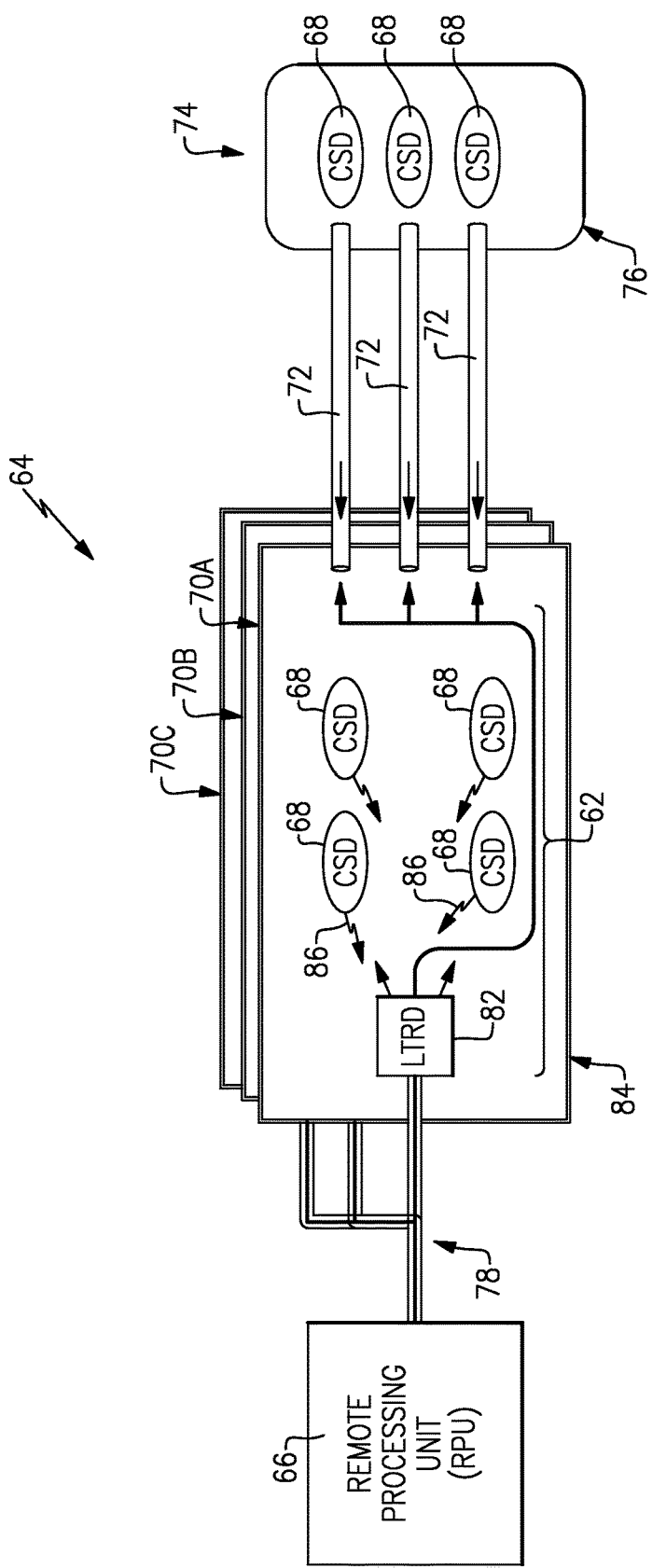
FIG. 2 is a schematic view of an example control and health monitoring system including a shielded wireless network.

Referring to FIG. 2, this disclosed system 64 includes a SWiN 62 installed near, in, or on each of several subsystem components (SSC) 70A-C. Each of the SSCs 70*a-b* may be an engine component, actuator or any other machine part from which information and communication is performed for monitoring and/or control purposes. In this example, each of the SSCs 70A-C includes a SWiN 62 that is the primary means of communicating with one or multiple features of the particular SSC 70 or remotely located subcomponents 74. The components 74 may contain electronic circuits or sensors configured to communicate over the network.

The RPU 66 sends and receives data to and from the SSCs 70A-C and may also provide a communication link between different SSCs 70A-C. The RPU 66 may be located on the equipment near other system components or located remotely as desired to meet application requirements.

A transmission path (TP) 78 between the RPU 66 and a sub-system component 80 is used to send and receive data routed through the RPU 66 from a control module or other components. The TP 78 may be electrical wire, optic fiber, electromagnetic communication and/or communication utilizing visible or non-visible light. A local transmitter/receiver device (LTRD) 82 translates signals received through the TP 78 to the example SSC 70A such that signals communicated wirelessly from one or multiple CSDs 68 to the LTRD 82 can be multiplexed over a single TP 78 to the RPU 66.

The example CSDs 68 may be RFID devices that include processing, memory and/or the ability to connect to conventional sensors. The SSC 70 may contain radio frequency (R/F) antennas, magnetic devices or optic paths designed to communicate with each of the CSDs 68 such that one or multiple CSDs 68 can be accessed by any number of LTRDs 82 within the SSC 70A. The SSCs 70*a-c* may also use the wireless transmission path 72 that could be configured as an R/F, magnetic or optic waveguide transmission to the CSDs 68 located within the remotely located subcomponent 74.

Shielding 84 within and around the SSC 70A is provided such that electromagnetic energy or light interference with wireless signals shown schematically as arrows 86 within the SSC 70A are mitigated. Moreover, the shielding 84 provides that the signals 86 are less likely to propagate into the environment outside the SSC 70A and enable unauthorized access to information.

Radio Frequency Identification (RFID), electro-magnetic or optical devices implemented as the CSDs 68 can provide information indicative of a physical parameter such as pressure, temperature, speed, proximity, vibration, and/or other parameters used for monitoring and controlling component operation. The CSDs 68 may also include control devices such as a solenoid, switch or other physical actuation devices. Signals communicated over the wired TP 78 may employ techniques such as shielding or encryption to mitigate cyber security threats.

The disclosed system 64 containing the SWiN (78, 62, 72) provides a communication link between the RPU 66 and multiple sub-system components (70*a-c*, 74). The shielding 84, 76 is provided along the transmission path 78 and for each component 70*a-c* and 74 such that wireless communication and signals are shielded from outside interference and caused by environmental electromagnetic or optic interference. Moreover, the shielding 84, 76 prevents intentional interference with communication at each component. Intentional interference may take the form of unauthorized data capture, data insertion, general disruption and/or any other action that degrades system communication. Environmental sources of interference may originate from noise generated from proximate electrical systems in other components or machinery along with electrostatic fields, and/or any broadcast signals from transmitters or receivers. Additionally, pure environmental phenomena such as lightning or other atmospheric effects could interfere with local wireless communications. Accordingly, the individualized shielding 84, 76 for each of the SSCs 70*a-c* and 74 prevent the undesired interference with communication. The shielding 84, 76 may be applied to enclosed or semi-enclosed volumes that contain the CSDs 68.

It should be appreciated that while the example system 64 is explained by way of example with regard to a gas turbine engine 20 other machines and machine designs can be modified to incorporate built in shielding for each monitored or controlled components to enable the use of a SWiN. The disclosed system 64 includes the SWiN that enables consistent communication with wireless devices, such as the example CSDs 68, and removes variables encountered with wireless communications such as distance between transmitters and receiving devices, physical geometry in the field of transmission, control over transmission media such as air or fluids, control over air or fluid contamination through the use of filtering or isolation and knowledge of temperature and pressure.

The disclosed system 64 provides for localized transmission to CSDs 68 such that power requirements are minimized Localized transmission occurs within a shielded volume of each SSC 70*a-c*, 74 that is designed specifically to accommodate reliable wireless transmission for the application specific environment and configuration. Shielding of localized components is provided such that wireless signals are contained within the shielding 84 for that specific SSD 70*a-c*. The system 64 therefore enables communication with one or multiple CSDs 68 with one or several LTRDs 82 simultaneously. The example RPU 66 enables sending and receiving data between several different SSDs 70*a-c* and 74

The RPU 66 may be located on the equipment near other system components or located away from the machinery for any number of reasons.

The disclosed system 64 provides for the reduction in cable and interconnecting systems to reduce cost and increases reliability by reducing the number of physical interconnections. Reductions in cable and connecting systems further provides for a reduction in weight while enabling additional redundancy without significantly increasing cost. Moreover, additional sensors can be added without the need for additional wiring and connections that provides for increased accuracy and response.

The TP 78 between the RPU 66 and the SSCs 70a-c utilized to send and receive data from other components may take multiple forms such as electrical wire, optic fiber, radio frequency signals or energy within the visible or non-visible light spectrum. The numerous options for communication path enable additional design flexibility.

The LTRD 82 that transfers energy from the TP 78 to the SSC 70a-c such that one or multiple CSDs 68 can be multiplexed over one TP 78 to the RPU 66.

CSDs 68 could potentially consist of RFID devices that may or may not include processing, memory and/or the ability to connect to conventional sensors. Radio frequency (R/F) antennas, magnetic devices or optic paths within the SSCs 70a-c may be designed to communicate with one or multiple CSDs 68 that can be accessed by any number of corresponding LTRDs 82 within any one SSC 70a-c. Moreover, R/F, magnetic or optic waveguide transmission paths 72 can be utilized to communicate with individual wireless devices remotely located from the SSC 70a-c.

Shielding 84, 76 within and around the SSC 70a-c, 74 substantially prevents electromagnetic energy or light interference with signals and also makes it less likely that signals propagate into the surrounding environment to prevent unauthorized access to information.

Although the following system has been disclosed with respect to control of a machine such as a gas turbine engine, it is within the contemplation of this disclosure to utilize this system for application to any equipment that utilizes sensors and actuators.

Although an example embodiment has been disclosed, a worker of ordinary skill in this art would recognize that certain modifications would come within the scope of this disclosure. For that reason, the following claims should be studied to determine the scope and content of this disclosure.

What is claimed is:

1. A control system for a machine component comprising:
   at least one local transmitter/receiver;
   at least one device associated with a component and configured to communicate information indicative of operation of the component with the at least one local transmitter/receiver through wireless signals;
   shielding surrounding both the at least one local transmitter/receiver and the at least one device for containing the wireless signals proximate to the component;
   a remote processing unit disposed outside of the shielding in communication with the local transmitter/receiver;
   a shielded transmission path between the remote processing unit and the at least one local transmitter/receiver; and
   a waveguide transmission path defining a transmission path between a control sensing device and the at least one local transmitter/receiver.

2. The control system as recited in claim 1, wherein the component comprises a plurality of machine components and each of the plurality of machine components includes shielding surrounding the at least one local transmitter/receiver and at least one control/sensing device.

3. The control system as recited in claim 1, wherein the shielded transmission path comprises a physical connection between the remote processing unit and the at least one local transmitter/receiver.

4. The control system as recited in claim 1, wherein the at least one device comprises one of a radio frequency device, an optic device, and an electro-magnetic device.

5. The control system as recited in claim 1, wherein the at least one device comprises one or more of a control device and a sensing device.

6. The control system as recited in claim 1, wherein the at least one local transmitter/receiver comprises a plurality of local transmitter/receivers and the control sensing device is in communication with each of the plurality of local transmitter/receivers.

7. A control system for a machine component comprising:
   at least one local transmitter/receiver;
   at least one device associated with a component and configured to communicate with the at least one local transmitter/receiver through wireless signals;
   shielding surrounding both the at least one local transmitter/receiver and the at least one device for containing the wireless signals proximate to the component;
   a remote processing unit disposed outside of the shielding in communication with the local transmitter/receiver; and
   a sub-component and at least one device associated with the sub-component and in communication with the at least one local transmitter/receiver of a corresponding component through a waveguide transmission path.

8. A control system for a gas turbine engine comprising:
   at least one local transmitter/receiver mounted proximate to a component of the gas turbine engine;
   at least one device associated with the component and configured to communicate information indicative of operation of the component with the at least one local transmitter/receiver through wireless signals;
   shielding surrounding both the at least one local transmitter/receiver and the at least one device for containing the wireless signals proximate the component; and
   a remote processing unit disposed outside of the shielding in communication with the at least one local transmitter/receiver; and
   a shielded transmission path between the remote processing unit and the at least one local transmitter/receiver.

9. The control system as recited in claim 8, wherein the component is part of at least one of a fan section, a compressor section, a combustor section and a turbine section.

10. The control system as recited in claim 8, wherein the component contains a parameter of interest to the control and health monitoring system, wherein the parameter of interest is one of a pressure, a temperature, a speed, a position, vibration and proximity.

11. The control system as recited in claim 8, wherein the transmission path comprises a shielded physical connection between the remote processing unit and the at least one local transmitter/receiver.

12. The control system as recited in claim 8, including a waveguide transmission path defining a transmission path between the at least one device associated with the component and the at least one local transmitter/receiver.

13. A method of communicating information within a machine comprising:

shielding a volume associated with a component such that wireless signals generated within the shielded volume are not transmitted outside of the shielded volume;

communicating information indicative of component operation with a device located within the shielded volume; and communicating information between the device to a remote processing unit outside of the shielded volume with at least one local transmitter/receiver within the shielded volume; and communicating information between the device located within the shielded volume and the at least one local transmitter/reviver through a waveguide transmission path.

14. The method as recited in claim 13, including communicating over a transmission path comprising a physical shielded connection between the remote processing unit and the at least one local transmitter/receiver.

15. The method as recited in claim 14, wherein the device communicates a signal including information indicative of component operation to the at least one local transmitter/receiver and then through the transmission path to the remote processing unit.

16. The method as recited in claim 14, wherein a control/sensing device comprises a control device and communicating information indicative of component operation comprises transmitting a signal directing actuation of the control device from the remote processing unit through the transmission path to the local transmitter/receiver and through a wireless signal from the local transmitter/receiver to the control device.

* * * * *